(12) United States Patent
Yoon et al.

(10) Patent No.: US 11,387,791 B2
(45) Date of Patent: Jul. 12, 2022

(54) SPATIAL POWER-COMBINING DEVICES WITH REDUCED SIZE

(71) Applicant: Qorvo US, Inc., Greensboro, NC (US)

(72) Inventors: Soack Dae Yoon, Torrance, CA (US); Dana Jay Sturzebecher, Cary, NC (US); Patrick Courtney, Newbury Park, CA (US)

(73) Assignee: QORVO US, INC., Greensboro, NC (US)

( * ) Notice: Subject to any disclaimer, the term of this patent is extended or adjusted under 35 U.S.C. 154(b) by 167 days.

(21) Appl. No.: 16/820,880

(22) Filed: Mar. 17, 2020

(65) Prior Publication Data

US 2021/0297048 A1    Sep. 23, 2021

(51) Int. Cl.

| H03F 3/19 | (2006.01) |
| H03F 3/21 | (2006.01) |
| H01P 3/08 | (2006.01) |
| H01L 23/00 | (2006.01) |
| H01P 3/06 | (2006.01) |

(52) U.S. Cl.
CPC ............... *H03F 3/19* (2013.01); *H01L 24/45* (2013.01); *H01P 3/06* (2013.01); *H01P 3/081* (2013.01); *H03F 3/211* (2013.01); *H01L 2924/1423* (2013.01)

(58) Field of Classification Search
CPC . H03F 3/19; H03F 3/211; H01L 24/45; H01L 2924/1423; H01P 3/06; H01P 3/081
USPC ........................................................ 330/286
See application file for complete search history.

(56) References Cited

U.S. PATENT DOCUMENTS

| 3,023,382 A | 2/1962 | Borghetti |
| 4,234,854 A | 11/1980 | Schellenberg et al. |
| 4,424,496 A | 1/1984 | Nichols et al. |
| 4,612,512 A | 9/1986 | Powell et al. |
| 4,724,400 A | 2/1988 | Luettgenau |

(Continued)

FOREIGN PATENT DOCUMENTS

| EP | 2469996 A2 | 6/2012 |
| EP | 3279597 A1 | 2/2018 |

(Continued)

OTHER PUBLICATIONS

Non-Final Office Action for U.S. Appl. No. 16/288,735, dated May 3, 2021, 8 pages.

(Continued)

*Primary Examiner* — Hafizur Rahman
(74) *Attorney, Agent, or Firm* — Withrow & Terranova, P.L.L.C.

(57) ABSTRACT

Spatial power-combining devices with reduced dimensions are disclosed. Spatial power-combining devices are provided that employ a hybrid structure including both a planar splitter/combiner and an antipodal antenna array. Planar splitters may be arranged to divide an input signal while antipodal antenna arrays may be arranged to combine amplified signals. In other applications, the order may be reversed such that antipodal antenna arrays are arranged to divide an input signal while a planar combiner is arranged to combine amplified signals. Advantages of such spatial power-combining devices include reduced size and weight while maintaining suitable performance for operation in desired frequency bands.

25 Claims, 6 Drawing Sheets

(56) References Cited

U.S. PATENT DOCUMENTS

| | | | |
|---|---|---|---|
| 5,036,335 | A | 7/1991 | Jairam |
| 5,162,803 | A | 11/1992 | Chen |
| 5,214,394 | A | 5/1993 | Wong |
| 5,256,988 | A | 10/1993 | Izadian |
| 5,736,908 | A | 4/1998 | Mexanian et al. |
| 5,920,240 | A | 7/1999 | Alexanian et al. |
| 6,028,483 | A | 2/2000 | Shealy et al. |
| 6,037,840 | A | 3/2000 | Myer |
| 6,181,221 | B1 | 1/2001 | Kich et al. |
| 6,828,875 | B2 | 12/2004 | Channabasappa et al. |
| 7,110,165 | B2 | 9/2006 | Martin et al. |
| 7,215,220 | B1 | 5/2007 | Jia |
| 7,466,203 | B2 | 12/2008 | Rector |
| 8,698,577 | B2 | 4/2014 | Sherrer et al. |
| 8,801,922 | B2 | 8/2014 | Wrazel et al. |
| 8,928,429 | B2 | 1/2015 | Song et al. |
| 9,019,036 | B2 | 4/2015 | Kolias et al. |
| 9,054,427 | B2 | 6/2015 | Guy et al. |
| 9,065,163 | B1 | 6/2015 | Wu et al. |
| 9,276,304 | B2 | 3/2016 | Behan et al. |
| 9,287,605 | B2 | 3/2016 | Daughenbaugh, Jr. et al. |
| 9,293,801 | B2 | 3/2016 | Courtney et al. |
| 9,325,074 | B2 | 4/2016 | Chandler |
| 9,547,344 | B2 | 1/2017 | Han |
| 9,917,343 | B2 | 3/2018 | Chieh et al. |
| 9,954,706 | B1 | 4/2018 | Harris et al. |
| 10,003,118 | B2 | 6/2018 | Kitt |
| 10,009,067 | B2 | 6/2018 | Birk et al. |
| 10,164,667 | B1 | 12/2018 | Kitt |
| 2004/0108903 | A1* | 6/2004 | Channabasappa ........ H01P 5/16 330/295 |
| 2006/0202777 | A1 | 9/2006 | Deckman et al. |
| 2007/0229186 | A1 | 10/2007 | Hacker et al. |
| 2007/0279146 | A1 | 12/2007 | Rector |
| 2010/0065256 | A1 | 3/2010 | Wilcoxon et al. |
| 2011/0300230 | A1 | 12/2011 | Peterson et al. |
| 2013/0003309 | A1 | 1/2013 | Stella |
| 2014/0145794 | A1 | 5/2014 | Courtney et al. |
| 2014/0145795 | A1 | 5/2014 | Behan et al. |
| 2014/0167880 | A1 | 6/2014 | Daughenbaugh, Jr. et al. |
| 2015/0270817 | A1 | 9/2015 | Campbell |
| 2017/0149113 | A1 | 5/2017 | Theveneau et al. |
| 2017/0179598 | A1 | 6/2017 | Kitt |
| 2018/0187984 | A1 | 7/2018 | Manzo |
| 2018/0294539 | A1 | 10/2018 | Kitt |
| 2019/0007007 | A1 | 1/2019 | Kitt |
| 2019/0067778 | A1 | 2/2019 | Mohan |
| 2019/0067781 | A1 | 2/2019 | Mohan et al. |
| 2019/0067782 | A1 | 2/2019 | Mohan et al. |
| 2019/0067783 | A1 | 2/2019 | Mohan et al. |
| 2019/0067836 | A1 | 2/2019 | Mohan |
| 2019/0068123 | A1 | 2/2019 | Mohan et al. |
| 2019/0068140 | A1 | 2/2019 | Mohan et al. |
| 2019/0068141 | A1 | 2/2019 | Yoon et al. |
| 2019/0081453 | A1 | 3/2019 | Meehan et al. |
| 2019/0140356 | A1 | 5/2019 | Mohan |
| 2019/0312327 | A1 | 10/2019 | Kitt |
| 2020/0041209 | A1 | 2/2020 | Valenti et al. |
| 2020/0041210 | A1 | 2/2020 | Valenti et al. |
| 2020/0162046 | A1 | 5/2020 | Bojkov et al. |
| 2020/0185803 | A1 | 6/2020 | Mohan et al. |

FOREIGN PATENT DOCUMENTS

| | | | |
|---|---|---|---|
| EP | 3454370 A1 | 3/2019 | |
| FR | 3040242 A1 * | 2/2017 | .............. H01P 5/085 |
| WO | 2017214357 A2 | 12/2017 | |
| WO | 2018134495 A1 | 7/2018 | |

OTHER PUBLICATIONS

Non-Final Office Action for U.S. Appl. No. 16/288,761, dated Apr. 1, 2021, 8 pages.

Examiner-Initiated Interview Summary for U.S. Appl. No. 16/288,761, dated Jun. 18, 2021, 2 pages.

Notice of Allowance for U.S. Appl. No. 16/288,761, dated Jun. 29, 2021, 7 pages.

Author Unknown, "Spatial Combining Technology: Revolutionizing the Microwave Power Amplifier," Microwave Journal, Sep. 8, 2008, http://www.microwavejournal.com/articles/print/6838-spatial-combining, CAP Wireless Inc., 7 pages.

Author Unknown, "Vivaldi antenna," Wikipedia, web page last edited Feb. 7, 2017, accessed May 11, 2017, https://en.wikipedia.org/wiki/Vivaldi_antenna, Wikimedia Foundation, Inc., 2 pages.

Courtney, Patrick G. et al., "120 W Ka Band Power Amplifier Utilizing GaN MMICs and Coaxial Waveguide Spatial Power Combining," White Paper, May 2016, Qorvo, pp. 1-8.

Jia, Pengcheng et al., "Broadband High Power Amplifier using Spatial Power Combining Technique" IEEE Transactions on Microwave Theory and Techniques, vol. 51, Issue 12, Dec. 2003, IEEE, 4 pages.

Leggieri, Alberto et al., "The Squarax Spatial Power Combiner," Progress In Electromagnetics Research C, vol. 45, Oct. 2013, EMW Publishing, pp. 43-55.

Ortiz, Sean C., "High Power Spatial Combiners: Tile and Tray Approaches," Dissertation, North Carolina State University, Electrical Engineering, Nov. 2001, 194 pages.

Notice of Allowance for U.S. Appl. No. 15/290,749, dated Feb. 16, 2018, 9 pages.

Amjadi, S., et al., "Design of a Broadband Eight-Way Coaxial Wavelength Power Combiner," IEEE Transactions on Microwave Theory and Techniques, vol. 60, Issue 1, Nov. 15, 2011, pp. 39-45.

Beyers, R., et al., "Compact Conical-Line Power Combiner Design Using Circuit Models," IEEE Transactions on Microwave Theory and Techniques, vol. 62, Issue 11, Oct. 9, 2014, pp. 2650-2658.

Fathy, A., et al., "A Simplified Approach for Radial Power Combiners," IEEE Transactions on Microwave Theory and Techniques, vol. 54, No. 1, Jan. 2006, pp. 247-255.

Gharehkand, F., "Design of a 16 Way Radial Microwave Power Divider/Combiner with Rectangular Waveguide Output and Coaxial Inputs," International Journal of Electronics and Communications (AEU), vol. 68, 2014, pp. 422-428.

Tribak, A., et al., "Ultra-Broadband High Efficiency Mode Converter," Progress in Electromagnetics Research C, vol. 36, 2013, pp. 145-158.

Montgomery, R., et al., "Solid-State PAs Battle TWTAsfor ECM Systems," Microwave Journal, Jun. 2017 Supplement, Jun. 14, 2017, 3 pages.

Möttönen, V. S., "Receiver Front-End Circuits and Components for Millimetre and Submillimetre Wavelengths," Dissertation for the degree of Doctor of Science in Technology, Helsinki University of Technology, Department of Electrical and Communications Engineering, Radio Laboratory, Apr. 2005, 40 pages.

Non-Final Office Action for U.S. Appl. No. 15/637,472, dated Aug. 10, 2018, 8 pages.

Notice of Allowance for U.S. Appl. No. 15/927,565, dated Aug. 8, 2018, 8 pages.

Author Unknown, "Interpack 2005: An assessment for PMMI members," 2005, PMMI, 32 pages.

Caturla, F., et al., "Electroless Plating of Graphite with Copper and Nickel," Journal of the Electrochemical Soceity, vol. 142, Issue 12, Dec. 1995, The Electrochemical Society, Inc., pp. 4084-4090.

Fitzhugh, William, et al., "Modulation of Ionic Current Limitations by Doping Graphite Anodes," Journal of Electrochemical Society, vol. 165, Issue 10, Jul. 2018, The Electrochemical Society, 6 pages.

Larkins, Grover, et al., "Evidence of Superconductivity in Doped Graphite and Graphene," Superconductor Science and Technology, vol. 29, Issue 1, Dec. 2015, IOP Publishing Ltd, 18 pages.

Glenis, S., et al., "Sulfur doped graphite prepared via arc discharge of carbon rods in the presence of thiopenes," Journal of Applied Physics, vol. 86, Issue 8, Oct. 1999, American Institute of Physics, pp. 4464-4466.

Scheike, T., et al., "Can doping graphite trigger room temperature superconductivity: Evidence for granular high-temperature superconductivity in water-treated graphite powder," Advanced Materials, vol. 24, Issue 43, Sep. 2012, 19 pages.

(56) References Cited

OTHER PUBLICATIONS

Smalc, Martin, et al., "Thermal Performance of Natural Graphite Heat Spreaders," Proceedings of IPACK2005, Jul. 17-22, San Francisco, California, American Society of Mechanical Engineers, 11 pages.
Notice of Allowance for U.S. Appl. No. 15/637,472, dated Mar. 12, 2019, 7 pages.
Non-Final Office Action for U.S. Appl. No. 15/846,840, dated Mar. 21, 2019, 4 pages.
Notice of Allowance for U.S. Appl. No. 15/845,225, dated Jan. 10, 2019, 7 pages.
Notice of Allowance for U.S. Appl. No. 16/166,548, dated Nov. 29, 2018, 8 pages.
Non-Final Office Action for U.S. Appl. No. 15/933,783, dated May 1, 2019, 8 pages.
Non-Final Office Action for U.S. Appl. No. 16/042,351, dated Jul. 5, 2019, 5 pages.
Notice of Allowance for U.S. Appl. No. 15/846,840, dated Jul. 5, 2019, 7 pages.
Non-Final Office Action for U.S. Appl. No. 15/981,535, dated Jul. 8, 2019, 5 pages.
Non-Final Office Action for U.S. Appl. No. 16/005,794, dated Oct. 7, 2019, 11 pages.
Notice of Allowance for U.S. Appl. No. 16/005,794, dated Jan. 9, 2020, 7 pages.
Corrected Notice of Allowability and Examiner-Initiated Interview Summary for U.S. Appl. No. 16/005,794, dated May 26, 2020, 6 pages.
Non-Final Office Action for U.S. Appl. No. 16/032,252, dated Dec. 27, 2019, 5 pages.
Notice of Allowance for U.S. Appl. No. 16/032,252, dated Jun. 1, 2020, 7 pages.
Notice of Allowance for U.S. Appl. No. 16/042,351, dated Nov. 18, 2019, 7 pages.
Non-Final Office Action for U.S. Appl. No. 16/008,586, dated Oct. 24, 2019, 10 pages.
Notice of Allowance for U.S. Appl. No. 16/008,586, dated Feb. 4, 2020, 8 pages.
Corrected Notice of Allowance and Examiner-Initiated Interview Summary for U.S. Appl. No. 15/846,840, dated Dec. 12, 2019, 6 pages.
Corrected Notice of Allowance and Applicant-Initiated Interview Summary for U.S. Appl. No. 15/846,840, dated Dec. 31, 2019, 6 pages.
Notice of Allowance for U.S. Appl. No. 15/981,535, dated Dec. 31, 2019, 7 pages.
Non-Final Office Action for U.S. Appl. No. 15/981,516, dated Jul. 17, 2019, 5 pages.
Notice of Allowance for U.S. Appl. No. 15/981,516, dated Jan. 15, 2020, 7 pages.
Non-Final Office Action for U.S. Appl. No. 15/933,821, dated Jul. 11, 2019, 7 pages.
Notice of Allowance for U.S. Appl. No. 15/933,821, dated Jan. 15, 2020, 7 pages.
Non-Final Office Action for U.S. Appl. No. 16/039,435, dated Jan. 7, 2020, 5 pages.
Notice of Allowance for U.S. Appl. No. 16/039,435, dated Jun. 17, 2020, 8 pages.
Notice of Allowance for U.S. Appl. No. 16/214,234, dated May 15, 2020, 8 pages.
Non-Final Office Action for U.S. Appl. No. 16/288,735, dated May 26, 2020, 9 pages.
Advisory Action, Examiner-Initiated Interview Summary, and AFCP 2.0 Decision for U.S. Appl. No. 16/191,541, dated May 21, 2020, 5 pages.
Final Office Action for U.S. Appl. No. 16/191,541, dated Mar. 31, 2020, 8 pages.
Non-Final Office Action for U.S. Appl. No. 16/191,541, dated Dec. 9, 2019, 7 pages.
Espera Jr., A.H. et al., "3D-printing and advanced manufacturing for electronics," Progress in Additive Manufacturing, Feb. 4, 2019, Springer, 24 pages.
Glasschroeder, J. et al., "Powder-bed-based 3D-printing of function integrated parts," Rapid Prototyping Journal, vol. 21, Issue 2, Emerald Group Publishing Limited, pp. 207-215.
Leigh, S.J. et al., "A Simple, Low-Cost Conductive Composite Material for 3D Printing of Electronic Sensors," PLoS One, vol. 7, Issue 11, Nov. 2012, 6 pages.
Sames, W.J. et al., "The Metallurgy and Processing Science of Metal Additive Manufacturing," 2016, available at https://www.osti.gov/servlets/purl/1267051, 76 pages.
Notice of Allowance for U.S. Appl. No. 16/191,541, dated Jul. 9, 2020, 7 pages.
Non-Final Office Action for U.S. Appl. No. 16/284,214, dated Aug. 20, 2020, 5 pages.
Notice of Allowance for U.S. Appl. No. 16/288,735, dated Oct. 29, 2020, 7 pages.
Notice of Allowance for U.S. Appl. No. 16/284,214, dated Jan. 6, 2021, 7 pages.
Non-Final Office Action for U.S. Appl. No. 16/928,092, dated Oct. 27, 2021, 5 pages.
Notice of Allowance for U.S. Appl. No. 16/288,735, dated Sep. 29, 2021, 8 pages.
Non-Final Office Action for U.S. Appl. No. 16/821,531, dated Nov. 10, 2021, 15 pages.
Notice of Allowance for U.S. Appl. No. 16/928,092, dated Mar. 30, 2022, 7 pages.
Notice of Allowance for U.S. Appl. No. 16/821,531, dated Mar. 10, 2022, 8 pages.

* cited by examiner

SPATIAL POWER-COMBINING DEVICES WITH REDUCED SIZE

FIELD OF THE DISCLOSURE

The disclosure relates generally to spatial power-combining devices and, more particularly, to spatial power-combining devices with reduced size.

BACKGROUND

Spatial power-combining devices are used for broadband radio frequency power amplification in commercial and defense communications, radar, electronic warfare, satellite, and various other communication systems. Spatial power-combining techniques are implemented by combining broadband signals from a number of amplifiers to provide output powers with high efficiencies and operating frequencies. One example of a spatial power-combining device utilizes a plurality of solid-state amplifier assemblies that form a coaxial waveguide to amplify an electromagnetic signal. Each amplifier assembly may include an input antenna structure, an amplifier, and an output antenna structure. When the amplifier assemblies are combined to form the coaxial waveguide, the input antenna structures may form an input antipodal antenna array, and the output antenna structures may form an output antipodal antenna array.

In operation, an electromagnetic signal is passed through an input port to an input coaxial waveguide section of the spatial power-combining device. The input coaxial waveguide section distributes the electromagnetic signal to be split across the input antipodal antenna array. The amplifiers receive the split signals and in turn transmit amplified split signals across the output antipodal antenna array. The output antipodal antenna array and an output coaxial waveguide section combine the amplified split signals to form an amplified electromagnetic signal that is passed to an output port of the spatial power-combining device.

Antenna structures for spatial power-combining devices typically include an antenna signal conductor and an antenna ground conductor deposited on opposite sides of a substrate, such as a printed circuit board. The size of the antenna structures are related to an operating frequency of the spatial power-combining device. For example, the size of the input antenna structure is related to the frequency of energy that can be efficiently received, and the size of the output antenna structure is related to the frequency of energy that can be efficiently transmitted. Overall sizes of spatial power-combining devices typically scale larger or smaller depending on desired operating frequency ranges. In most applications, antenna structures can arranged in close proximity to one another on adjacent amplifier assemblies.

The art continues to seek improved spatial power-combining devices having improved performance characteristics while being capable of overcoming challenges associated with conventional devices.

SUMMARY

Aspects disclosed herein relate to spatial power-combining devices and, more particularly, to spatial power-combining devices with reduced dimensions. As disclosed herein, spatial power-combining devices are provided that employ a hybrid structure including both a planar splitter/combiner and an antipodal antenna array. Planar splitters may be arranged to divide an input signal while antipodal antenna arrays may be arranged to combine amplified signals. In other applications, the order may be reversed such that antipodal antenna arrays are arranged to divide an input signal while a planar combiner is arranged to combine amplified signals. Advantages of such spatial power-combining devices include reduced size and weight while maintaining suitable performance for operation in desired frequency bands.

In one aspect, a spatial power-combining device comprises: an input port and an output port; a plurality of amplifier assemblies arranged between the input port and the output port, wherein each amplifier assembly of the plurality of amplifier assemblies comprises an amplifier and an output antenna structure coupled with the amplifier; and a planar signal splitter arranged between the input port and the plurality of amplifier assemblies. In certain embodiments, the planar signal splitter comprises a plurality of transmission lines on a substrate. In certain embodiments, the spatial power-combining device further comprises an input transmission line configured to receive an input signal from the input port. In certain embodiments, the plurality of transmission lines and the input transmission line comprise microstrip lines. In certain embodiments, a coaxial to microstrip transition is formed between the input port and the input transmission line. In certain embodiments, the planar signal splitter further comprises a plurality of power dividers arranged on the substrate and between one or more transmission lines of the plurality of transmission lines. In certain embodiments, the plurality of power dividers comprises a plurality of Wilkinson power dividers. In certain embodiments, a different transmission line of the plurality of transmission lines is configured to provide a portion of an input signal to each individual amplifier assembly of the plurality of amplifier assemblies.

In certain embodiments, the spatial power-combining device further comprises a mounting plate arranged between the planar signal splitter and the plurality of amplifier assemblies. In certain embodiments, a diameter of the planar signal splitter is less than a diameter of the mounting plate. In certain embodiments, the input port comprises a diameter that is the same as the diameter of the mounting plate.

In certain embodiments, the amplifier comprises a monolithic microwave integrated circuit (MMIC) amplifier. In certain embodiments, the output antenna structure comprises an output signal conductor and an output ground conductor. In certain embodiments, the plurality of amplifier assemblies is arranged radially around a center axis of the spatial power-combining device. In certain embodiments, the spatial power-combining device further comprises an output coaxial waveguide section arranged between the output port and the plurality of amplifier assemblies.

In another aspect, a spatial power-combining device comprises: a plurality of amplifier assemblies arranged between the input port and the output port, wherein each amplifier assembly of the plurality of amplifier assemblies comprises an amplifier and an antenna structure coupled with the amplifier; an input port and an output port; and a plurality of fasteners that extends through a flange of the input port or a flange of the output port such that the plurality of fasteners contacts the plurality of amplifier assemblies. In certain embodiments, the spatial power-combining device further comprises a planar signal splitter arranged between the input port and the plurality of amplifier assemblies. In certain embodiments, the plurality of fasteners extends through the planar signal splitter. In certain embodiments, the spatial power-combining device further comprises a mounting plate arranged between the planar signal splitter and the plurality of amplifier assemblies. In certain embodiments, the plurality of fasteners extends through the mounting plate. In certain embodiments, the planar signal splitter comprises a plurality of transmission lines coupled with a plurality of power dividers on a substrate. In certain embodiments, a length of the spatial power-combining device as measured between the input port and the output port is in a range including 2 inches and 3 inches.

In another aspect, a spatial power-combining device comprises: an input port and an output port; and a plurality of amplifier assemblies arranged between the input port and the output port, wherein each amplifier assembly of the plurality of amplifier assemblies comprises an amplifier and an antenna structure coupled with the amplifier; wherein the spatial power-combining device is configured to operate across a frequency range including 4 gigahertz (GHz) and 40 GHz and the spatial power-combining device comprises a length as measured between the input port and the output port that is less than 3 inches. In certain embodiments, the length is in a range including 2 inches and 3 inches. In certain embodiments, the spatial power-combining device further comprises a planar signal splitter arranged between the input port and the plurality of amplifier assemblies, wherein the antenna structure is an output antenna structure configured to combine amplified signals from the amplifier of each amplifier assembly of the plurality of amplifier assemblies. In certain embodiments, the spatial power-combining device further comprises a planar signal combiner arranged between the output port and the plurality of amplifier assemblies, wherein the antenna structure is an input antenna structure configured to divide an input signal from the input port.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

In certain embodiments, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
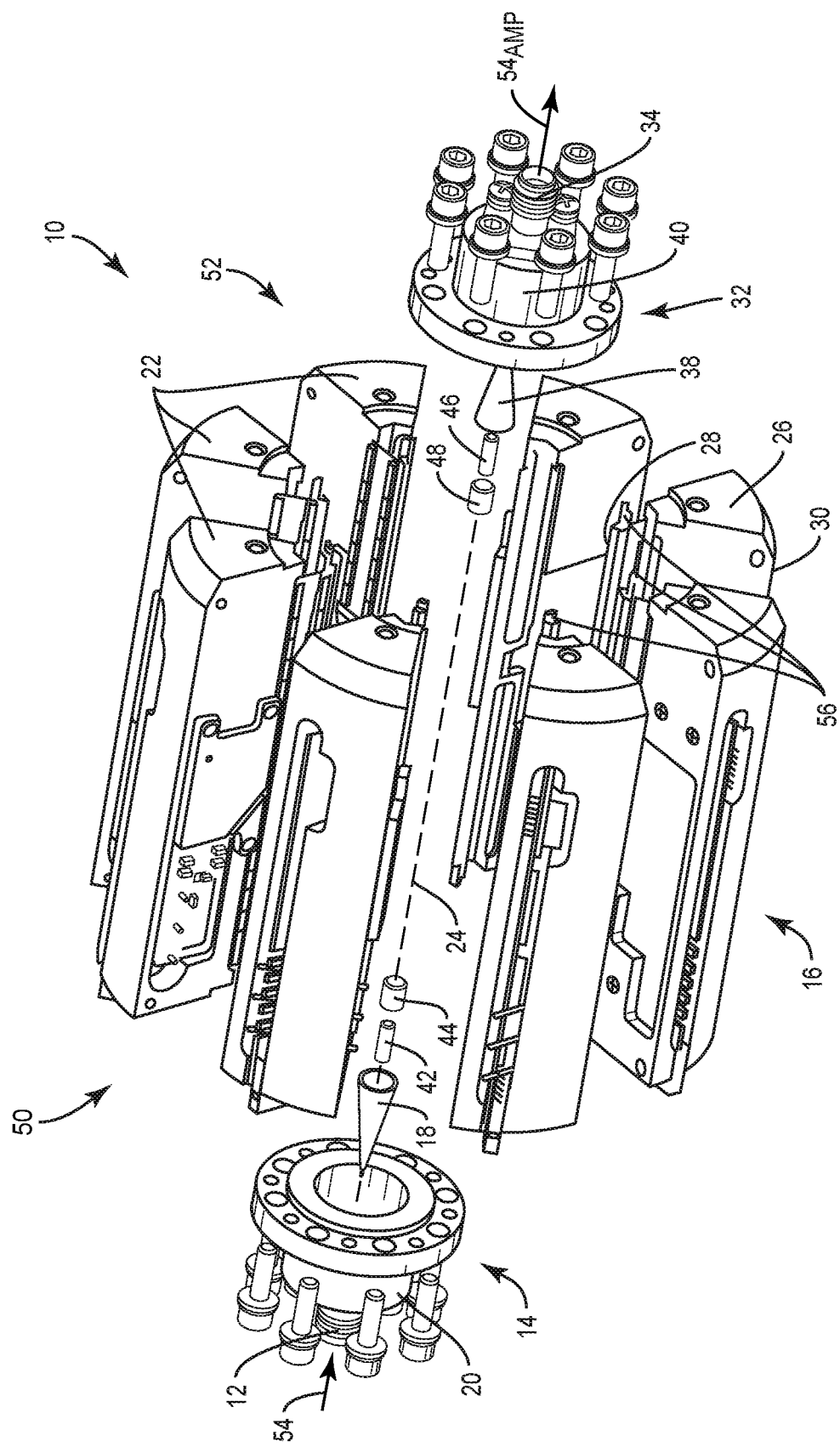
FIG. 1 is a perspective exploded view of a representative spatial power-combining device.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Common elements between figures may be shown herein with common element numbers and may not be subsequently re-described.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed herein relate to spatial power-combining devices and, more particularly, to spatial power-combining devices with reduced dimensions. As disclosed herein, spatial power-combining devices are provided that employ a hybrid structure including both a planar splitter/combiner and an antipodal antenna array. Planar splitters may be arranged to divide an input signal while antipodal antenna arrays may be arranged to combine amplified signals. In other applications, the order may be reversed such that antipodal antenna arrays are arranged to divide an input signal while a planar combiner is arranged to combine amplified signals. Advantages of such spatial power-combining devices include reduced size and weight while maintaining suitable performance for operation in desired frequency bands.

The embodiments are particularly adapted to spatial power-combining devices that operate at microwave frequencies, such as, by way of non-limiting example, energy between about 300 megahertz (MHz) (100 centimeters (cm) wavelength) and 300 gigahertz (GHz) (0.1 cm wavelength). Additionally, embodiments may comprise operating frequency ranges that extend above microwave frequencies. In some embodiments, by way of non-limiting examples, the operating frequency range includes an operating bandwidth of 4 GHz to 40 GHz, or 2 GHz to 18 GHz, or 2 GHz to 20 GHz, among others.

A spatial power-combining device typically includes a plurality of amplifier assemblies, and each amplifier assembly comprises an individual signal path that includes an amplifier connected to an input antenna structure and an output antenna structure. An input coaxial waveguide is configured to provide a signal concurrently to each input antenna structure, and an output coaxial waveguide is configured to concurrently combine amplified signals from each output antenna structure. The plurality of amplifier assemblies is arranged coaxially about a center axis. Accordingly, the spatial power-combining device is configured to split, amplify, and combine an electromagnetic signal.

FIG. 1 is a perspective exploded view of a representative spatial power-combining device 10. The spatial power-combining device 10 comprises an input port 12 and an input coaxial waveguide section 14. The input coaxial waveguide section 14 provides a broadband transition from the input port 12 to a center waveguide section 16. Electrically, the input coaxial waveguide section 14 provides broadband impedance matching from an impedance $Z_{p1}$ of the input port 12 to an impedance $Z_c$ of the center waveguide section 16. The input coaxial waveguide section 14 comprises an input inner conductor 18 and an input outer conductor 20. Outer surfaces of the input inner conductor 18 and inner surfaces of the input outer conductor 20 have gradually changed profiles configured to minimize the impedance mismatch from the input port 12 to the center waveguide section 16.

The center waveguide section 16 comprises a plurality of amplifier assemblies 22 arranged radially around a center axis 24 of the spatial power-combining device 10. Each amplifier assembly 22 comprises a body structure 26 having a predetermined wedge-shaped cross-section, an inner surface 28, and an arcuate outer surface 30. When the amplifier assemblies 22 are assembled radially about the center axis 24, they collectively form the center waveguide section 16 with a generally cylindrical shape; however, other shapes are possible, such as rectangular, oval, or other geometric shapes. The inner surface 28 and the outer surface 30 refer to how surfaces of each amplifier assembly 22 are configured when the plurality of amplifier assemblies 22 is radially arranged around the center axis 24, or a center post when included. For example, when assembled, the inner surface 28 of each amplifier assembly 22 is radially arranged around the center axis 24 and is internal to the center waveguide section 16, and the outer surface 30 of each amplifier assembly 22 collectively forms a cylindrical outer surface of the center waveguide section 16.

The spatial power-combining device 10 also comprises an output coaxial waveguide section 32 and an output port 34. The input port 12 and the output port 34 may comprise any of a field-replaceable Subminiature A (SMA) connector, a super SMA connector, a type N connector, a type K connector, a WR28 connector, other coaxial to waveguide transition connectors, or any other suitable coaxial or waveguide connectors. In applications where the operating frequency range includes a frequency of at least 18 GHz, the output port 34 may comprise a waveguide output port, such as a WR28 or other sized waveguide. The output coaxial waveguide section 32 provides a broadband transition from the center waveguide section 16 to the output port 34. Electrically, the output coaxial waveguide section 32 provides broadband impedance matching from the impedance $Z_c$ of the center waveguide section 16 to an impedance $Z_{p2}$ of the output port 34. The output coaxial waveguide section 32 comprises an output inner conductor 38 and an output outer conductor 40. Outer surfaces of the output inner conductor 38 and inner surfaces of the output outer conductor 40 have gradually changed profiles configured to minimize the impedance mismatch from the output port 34 to the center waveguide section 16. In some applications, impedance matching is configured for 50 ohms, although other designs such as 30 ohms are possible.

A first screw 42 and a first nut 44 are provided for mechanically attaching the input inner conductor 18 to the plurality of amplifier assemblies 22. In a similar manner, a second screw 46 and a second nut 48 are provided for mechanically attaching the output inner conductor 38 to the plurality of amplifier assemblies 22. The plurality of amplifier assemblies 22 comprises an input end 50 and an output end 52. The input inner conductor 18 is mechanically attached to the input end 50, and the output inner conductor 38 is mechanically attached to the output end 52. Accordingly, a spatial power-combining device 10 is provided that comprises a center waveguide section 16 comprising a plurality of amplifier assemblies 22, wherein the plurality of amplifier assemblies 22 forms an input end 50 and an output end 52, an input inner conductor 18 mechanically attached to the input end 50, and an output inner conductor 38 mechanically attached to the output end 52. In some applications, the input inner conductor 18 may be directly attached to the input end 50, and the output inner conductor 38 may be directly attached to the output end 52. In other spatial power-combining devices, inner conductors may be mechanically attached to a separate support element, such as a center post or rod. Amplifier assemblies may be stacked circumferentially around the center post and may have inner surfaces that conform to the outer shape of the center post. Accordingly, the conventional center post is provided for mechanical support and assembly of the spatial power-combining device.

In operation, the input port 12 receives a signal 54 and the input coaxial waveguide section 14 is configured to provide the signal 54 concurrently to each of the amplifier assemblies 22 where the signal 54 is concurrently amplified by the respective amplifier assemblies 22. The output coaxial waveguide section 32 is configured to concurrently combine the amplified signals to form an amplified output signal $54_{AMP}$, which is propagated through the output coaxial waveguide section 32 to the output port 34 for transmitting the amplified output signal $54_{AMP}$.

Figure 2:
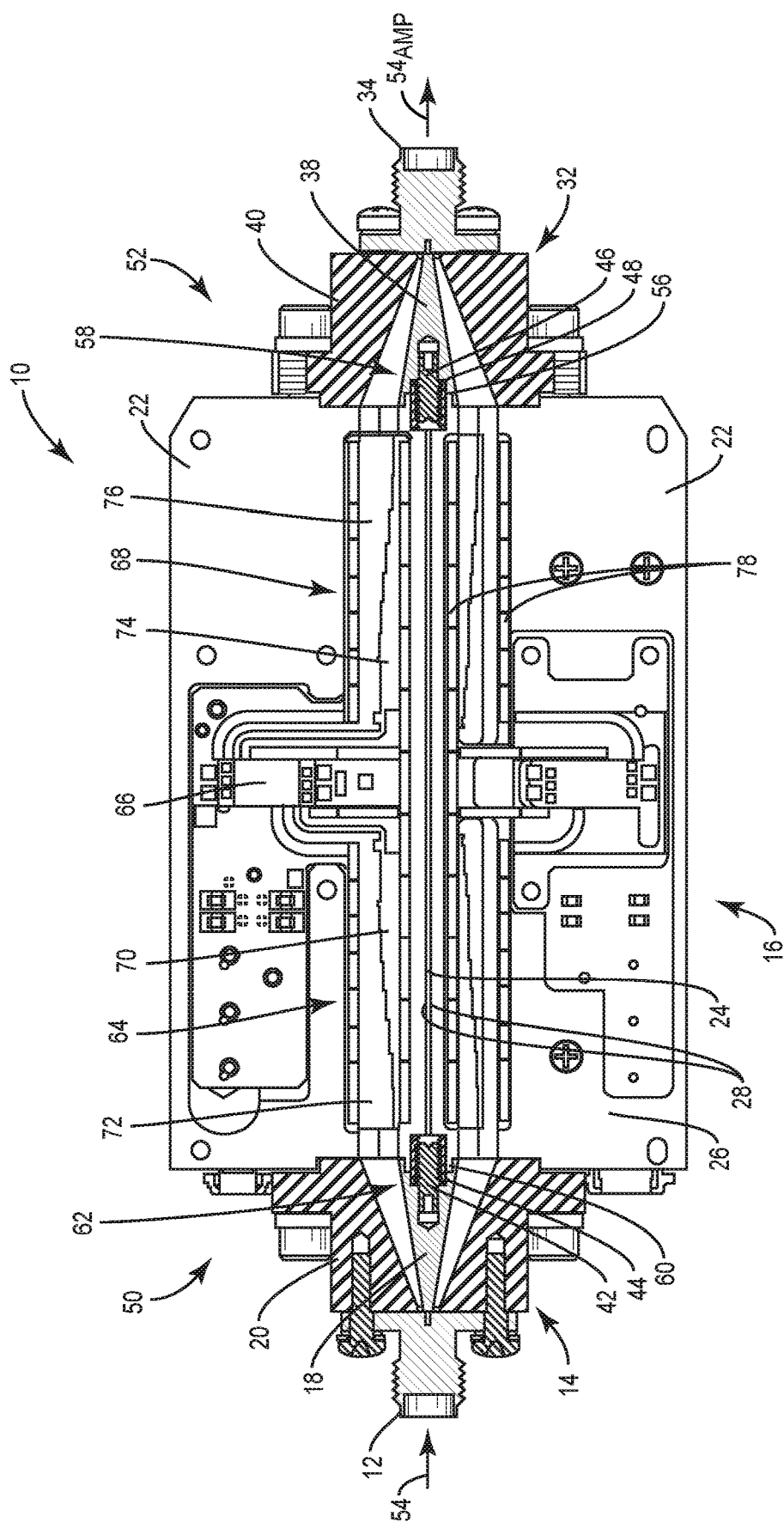
FIG. 2 is a partial and unexploded cross-sectional view of the spatial power-combining device of FIG. 1.

FIG. 2 is a partial and unexploded cross-sectional view of the spatial power-combining device 10 of FIG. 1. Several amplifier assemblies 22 are omitted to illustrate the following details. Both the input end 50 and the output end 52 of the plurality of amplifier assemblies 22 are visible within the center waveguide section 16. The input port 12 and input coaxial waveguide section 14 are located adjacent the input end 50, and the output port 34 and output coaxial waveguide section 32 are located adjacent the output end 52. The input coaxial waveguide section 14 comprises the input inner conductor 18 and the input outer conductor 20, and the output coaxial waveguide section 32 comprises the output inner conductor 38 and the output outer conductor 40. Output connector portions 56 of the plurality of amplifier assemblies 22 collectively form an output connector receptacle 58, and input connector portions 60 of the plurality of amplifier assemblies 22 collectively form an input connector receptacle 62. As shown, the input inner conductor 18 is configured to mechanically attach to the input end 50 at the input connector receptacle 62 by the first screw 42, and the output inner conductor 38 is configured to mechanically attach to the output end 52 at the output connector receptacle 58 by the second screw 46. The first nut 44 is inside the input connector receptacle 62 and is configured to receive the first screw 42, and the second nut 48 is inside the output connector receptacle 58 and is configured to receive the second screw 46. The mechanical attachment of the input inner conductor 18 and the output inner conductor 38 to the input end 50 and output end 52, respectively, allows the center axis 24 to be hollow, and thus the inner surface 28 of the body structure 26 of each amplifier assembly 22 may be separated from the center axis 24 by empty space. For example, the inner surface 28 of each amplifier assembly 22 is separated from the center axis 24 completely by empty space, with no support structure in between. In some applications, the inner surface 28 of each amplifier assembly 22 is spaced from the center axis 24 by a distance of no more than 50 mil, and in further applications the spacing may be smaller. For example, the inner surface 28 of each amplifier assembly 22 may be spaced from the center axis 24 by a distance of about 10 mil. Amplifier assemblies in other spatial power-combining devices are not spaced from a center axis by a distance of 50 mil or less due to the presence of the center rod. For example, other spatial power-combining devices with center rods typically have amplifier assemblies spaced from the center axis by at least 80 mil.

Accordingly, the spacing of the amplifier assemblies can be reduced to achieve higher frequency operation and increased bandwidth. In some applications, the operating frequency range includes an operating bandwidth spread of 4 GHz to 41 GHz. For such applications, the reduced spacing may only allow for a reduced number of amplifier assemblies. In some applications, the plurality of amplifier assemblies comprises fewer than ten amplifier assemblies. For an operating bandwidth spread of 4 GHz to 41 GHz, some applications may comprise eight amplifier assemblies and may therefore be referred to as an eight-way spatial power-combining device, as represented in FIG. 1. In other applications with a lower operating bandwidth spread, such as 2 GHz to 20 GHz, the spacing may be greater than these ranges and more amplifier assemblies may be included.

As shown in FIG. 2, each amplifier assembly 22 comprises an input antenna structure 64, an amplifier 66, and an output antenna structure 68. In some applications, the amplifier 66 comprises a monolithic microwave integrated circuit (MMIC) amplifier. The MMIC may comprise a solid-state gallium nitride (GaN)-based MMIC or a gallium arsenide (GaAs)-based MMIC. A GaN MMIC device provides high power density and bandwidth, and a spatial power-combining device may combine power from a plurality of GaN MMICs efficiently in a single step to minimize combining loss. The input antenna structure 64 comprises an input antenna pattern 70 supported on a first board 72, and the output antenna structure 68 comprises an output antenna pattern 74 supported on a second board 76. The first board 72 and second board 76 may be printed circuit boards that provide the desired form factor and mechanical support for the input antenna pattern 70 and output antenna pattern 74, respectively. It is understood that both the input antenna pattern 70 and the output antenna pattern 74 may include signal and ground portions on opposing sides of the first board 72 and second board 76, respectively. Additionally, one or more electromagnetic interference filters 78 are supported on both the first board 72 and the second board 76. The electromagnetic interference filters 78 are located around the input antenna pattern 70 and output antenna pattern 74 to help suppress modes and reduce leakage between the amplifier assemblies 22. In other applications, the input antenna pattern 70 and output antenna pattern 74 may comprise metal that is thick enough to be incorporated into each amplifier assembly 22 without requiring a first board 72 or second board 76 for support. In certain applications, the input antenna structure 64 and the output antenna structure 68 are electrically grounded with the body structure 26.

In operation, the signal 54 enters through the input port 12 and propagates through the input coaxial waveguide section 14 to the input antenna structure 64 of each amplifier assembly 22. Each input antenna structure 64 couples the signal 54 to each amplifier 66, and each output antenna structure 68 couples the amplified signal $54_{AMP}$ to the output coaxial waveguide section 32 to be propagated to the output port 34. The spatial power-combining device 10 is typically utilized for high power-combining applications, and the amplifier 66 in each of the amplifier assemblies 22 is configured for high power amplification, and may therefore generate a high amount of heat. Accordingly, the body structure 26 of each amplifier assembly 22 may typically comprise a highly thermally conductive material, such as copper (Cu), aluminum (Al), or alloys thereof that are configured to dissipate enough heat from the amplifier 66 to maintain a suitably low operating temperature. Additionally, another metal layer, such as silver (Ag), may be plated on the other materials. In addition to highly thermally conductive metals, the body structure 26 may comprise highly thermally conductive polymers and ceramics, including graphite or graphene, or other highly thermally conductive materials.

As modern electronics advance toward smaller and more compact applications, smaller and more compact spatial power-combining devices are desired. As previously described, overall sizes of spatial power-combining devices typically scale larger or smaller according to their target operating frequency bands. In particular, relative sizes of antenna structures are correlated to the frequency of energy that can be efficiently received and/or transmitted. In this regard, it can be difficult to reduce the size of a spatial power-combining device without reducing relative sizes of antenna structures, thereby altering a target operating frequency band. According to embodiments disclosed herein, spatial power-combining devices are disclosed that employ a hybrid structure that replaces one of an input antipodal antenna array or an output antipodal antenna array with a planar signal splitter or combiner. By way of example, an exemplary spatial power-combining device may include a planar signal splitter that is arranged on an input side of a plurality of amplifier assemblies and an antipodal antenna array that is arranged on an output side of the plurality of amplifier assemblies. In this regard, the exemplary spatial power-combining device may be configured with reduced size and weight attributed to replacing an input antipodal antenna array with a planar signal splitter while maintaining a size of the output antipodal antenna array for operation in a same frequency band.

Figure 3:
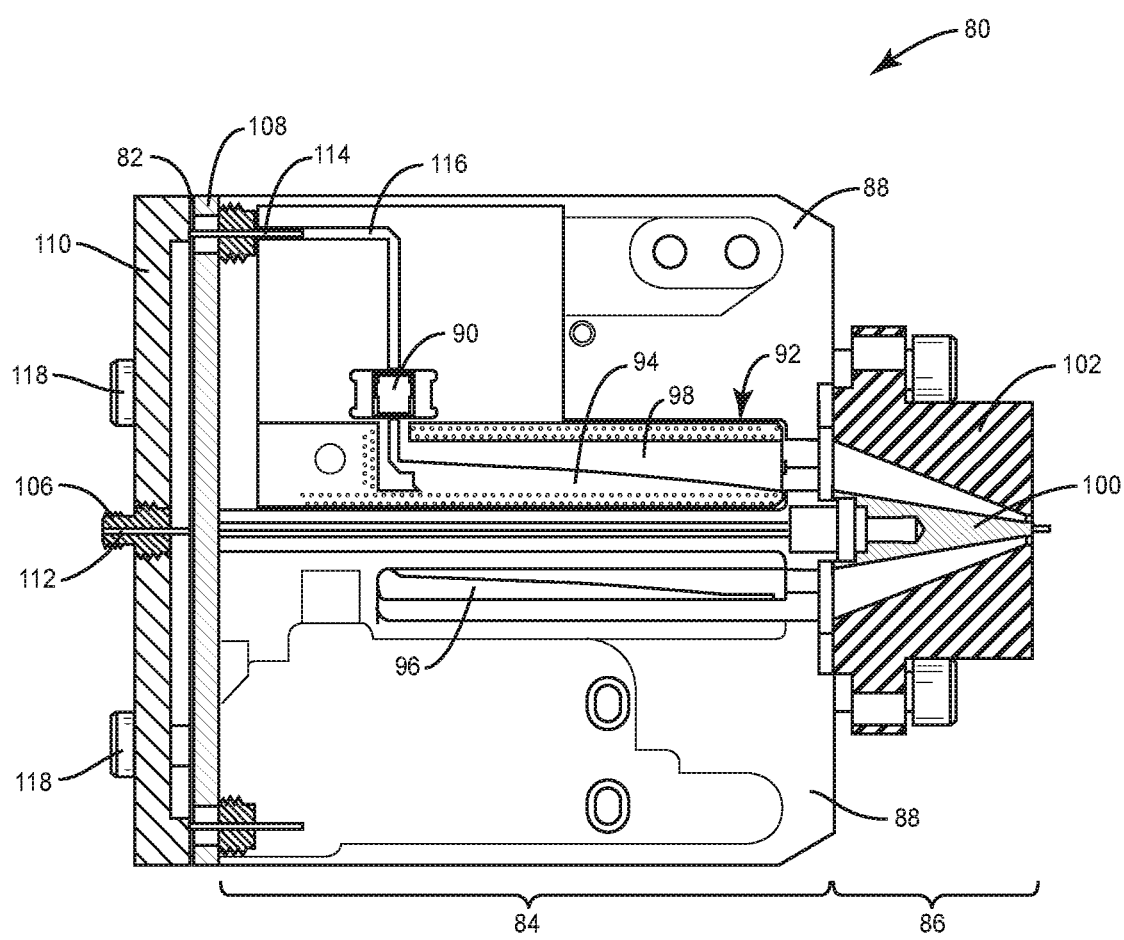
FIG. 3 is a partial cross-sectional view of a spatial power-combining device that comprises a planar signal splitter and a center waveguide section that includes an output antipodal antenna array.

FIG. 3 is a partial cross-sectional view of a spatial power-combining device 80 that comprises a planar signal splitter 82 and a center waveguide section 84 that includes an output antipodal antenna array. As illustrated, the center waveguide section 84 is arranged between the planar signal splitter 82 and an output coaxial waveguide section 86. The center waveguide section 84 includes a plurality of amplifier assemblies 88 provided in a radial arrangement. Each amplifier assembly 88 includes an amplifier 90 and an output antenna structure 92. In certain embodiments, the amplifier 90 comprises a MMIC amplifier, such as a solid-state GaN-based MMIC. As previously described, a GaN MMIC device provides high power density and bandwidth, and a spatial power-combining device may combine power from a plurality of GaN MMICs efficiently in a single step to minimize combining loss. The output antenna structure 92 comprises an output signal conductor 94 and an output ground conductor 96 that are supported on opposing faces of a board 98. In FIG. 3, the output ground conductor 96 for the amplifier assembly 88 at the bottom of the illustration is visible from a backside of that amplifier assembly 88. The board 98 may comprise a printed circuit board or the like that provides a desired form factor and mechanical support for the output signal conductor 94 and the output ground conductor 96 of each amplifier assembly 88. In this regard, the plurality of amplifier assemblies 88 forms an output antipodal antenna array that is arranged to propagate amplified signals from the amplifiers 90 to the output coaxial waveguide section 86. The output coaxial waveguide section 86 comprises an output inner conductor 100 and an output outer conductor 102 as previously described. Additionally, the output coaxial waveguide section 86 may be mechanically attached to each amplifier assembly 88 as described for FIG. 2.

The planar signal splitter 82 is arranged to receive an input signal from an input port 106 and split and direct the input signal to each amplifier assembly 88. A mounting plate 108 may be arranged between the planar signal splitter 82 and the amplifier assemblies 88. In certain embodiments, the input port 106 may include a flange 110 that extends to entirely cover a surface of the planar signal splitter 82 that is opposite the mounting plate 108. In this regard, the input port 106 and the mounting plate 108 may comprise diameters that are greater than the planar signal splitter 82. In certain embodiments, the diameter of the input port 106 including the flange 110 is the same as the diameter of the mounting plate 108. The mounting plate 108 may be provided between the planar signal splitter 82 and the amplifier assemblies 88 for mechanical support. In certain embodiments, the mounting plate 108 comprises a highly thermally conductive material, such as Cu, Al, or alloys thereof. The mounting plate 108 may additionally comprise another metal layer, such as Ag, that may be plated on the other materials. In addition to highly thermally conductive metals, the mounting plate 108 may comprise highly thermally conductive polymers and ceramics, including graphite or graphene, or other highly thermally conductive materials. In certain embodiments, the mounting plate 108 comprises a same material as the amplifier assemblies 88. In other embodiments, the mounting plate 108 comprises a different material as the amplifier assemblies 88.

For embodiments where the input port 106 comprises a coaxial input port, an input coaxial pin 112 of the input port 106 may be configured to provide the input signal to the planar signal splitter 82. An amplifier assembly coaxial pin 114 may be arranged with each amplifier assembly 88 to provide split input signals from the planar signal splitter 82 to an electrical trace 116 that is provided on each board 98. The electrical trace 116 thereby provides each split signal to each amplifier 90 for amplification. As illustrated, the planar signal splitter 82 provides a slim profile relative to the plurality of amplifier assemblies 88. In this regard, an overall size or dimension of the spatial power-combining device 80 may be reduced by eliminating the need for input antenna structures (64 of FIG. 2) from the center waveguide section 84. By way of example, the spatial power-combining device 10 of FIG. 2 and the spatial power-combining device 80 may both be configured to operate in a frequency band including 4 GHz and 40 GHz. In such a configuration, the spatial power-combining device 10 of FIG. 2 may have a length as measured from the input port 12 to the output port 34 of 4 inches and a diameter of the center waveguide section 16 of 2 inches in certain embodiments. For the same operating frequency band, the spatial power-combining device 80 may have a length as measured the same way that is no more than 3 inches, or no more than 2.5 inches, or in a range including 2 inches and 3 inches, with the same diameter for the center waveguide section 84. While the above example is provided for 4 GHz and 40 GHz operation, other spatial power-combining devices operating at different frequency bands may have similar reductions in length when configured according to the spatial power-combining device 80 of FIG. 3. In this regard, reductions in length of at least 33% are possible compared with conventional spatial power-combining arrangements.

Notably, the input port 106 may be attached to the amplifier assemblies 88 by one or more fasteners 118 without the input coaxial waveguide section 14 of FIG. 2. For example, the one or more fasteners 118 may extend through the flange 110 of the input port 106, the planar signal splitter 82, and the mounting plate 108 to contact and mechanically couple with the amplifier assemblies 88. In this regard, a number of the fasteners 118 may be the same as a number of the amplifier assemblies 88. In certain embodiments, the fasteners 118 may comprise one or more of threaded bolts or screws. As such, the input port 106 may be directly attached to the amplifier assemblies 88, thereby reducing an overall length of the spatial power-combining device 80.

FIG. 3 illustrates the planar signal splitter 82 arranged at an input side of the spatial power-combining device 80 and the radially arranged output antenna structures 92 arranged at an output side. Such an arrangement may provide reduced length while maintaining low output frequency loss and high output power-combining performance. In other embodiments, other arrangements are possible. For example, the order may be reversed such that input antenna structures are radially arranged to receive and split an input signal for amplification and a planar signal combiner replaces the output antenna structures 92 for receiving and combining amplified signals into an amplified output signal. Such a device may appear the same as illustrated in FIG. 3, only with the signal propagation in the reverse order through the spatial power-combining device 80.

Figure 4:
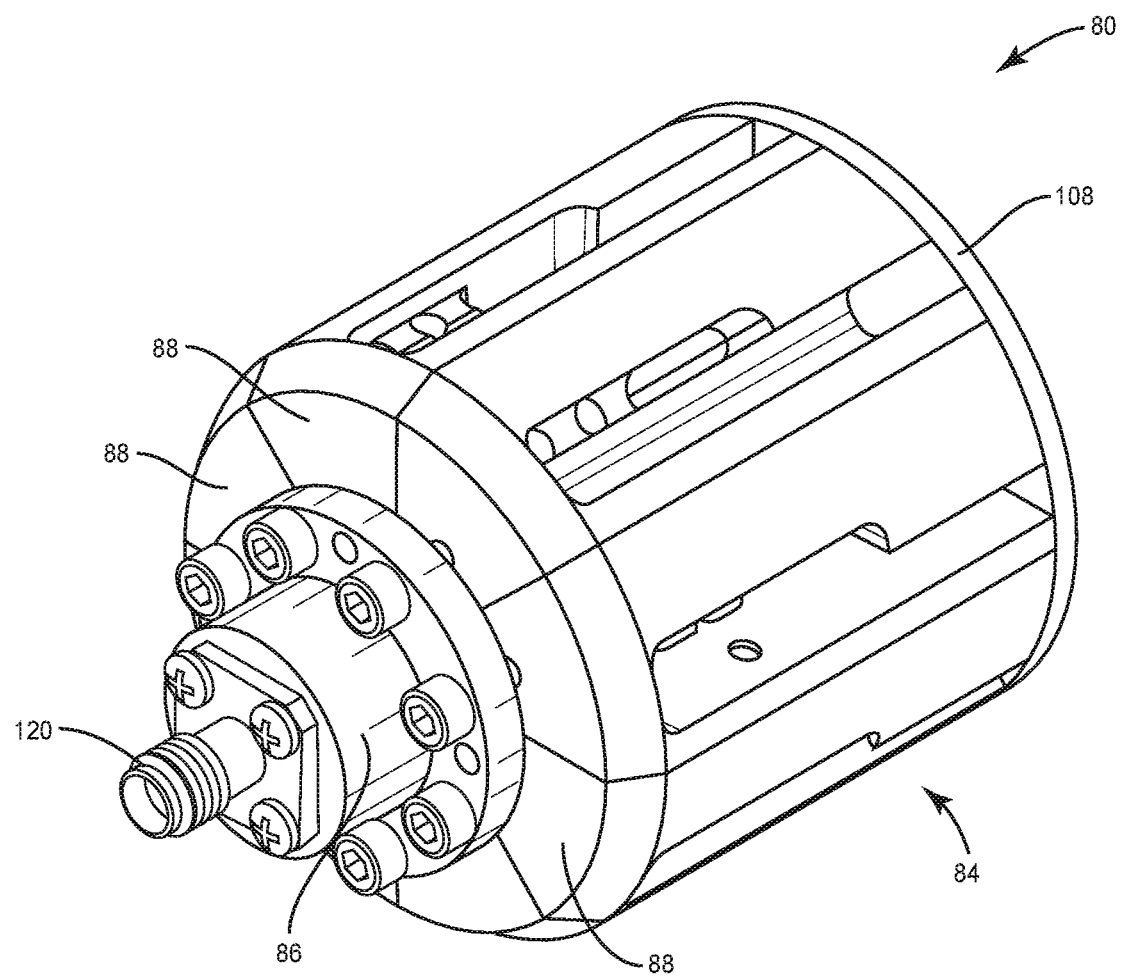
FIG. 4 is a partial perspective view of the spatial power-combining device of FIG. 3 from a side that includes an output coaxial waveguide section.

FIG. 4 is a partial perspective view of the spatial power-combining device 80 of FIG. 3 from a side that includes the output coaxial waveguide section 86. As illustrated, the amplifier assemblies 88 are radially arranged to form the center waveguide section 84. The mounting plate 108 is provided at an opposite side of the center waveguide section 84 as the output coaxial waveguide section 86. For illustrative purposes, the input port 106 is omitted. An output port 120 is provided at the output coaxial waveguide section 86 as previously described for the output port 34 of FIG. 1.

Figure 5A:
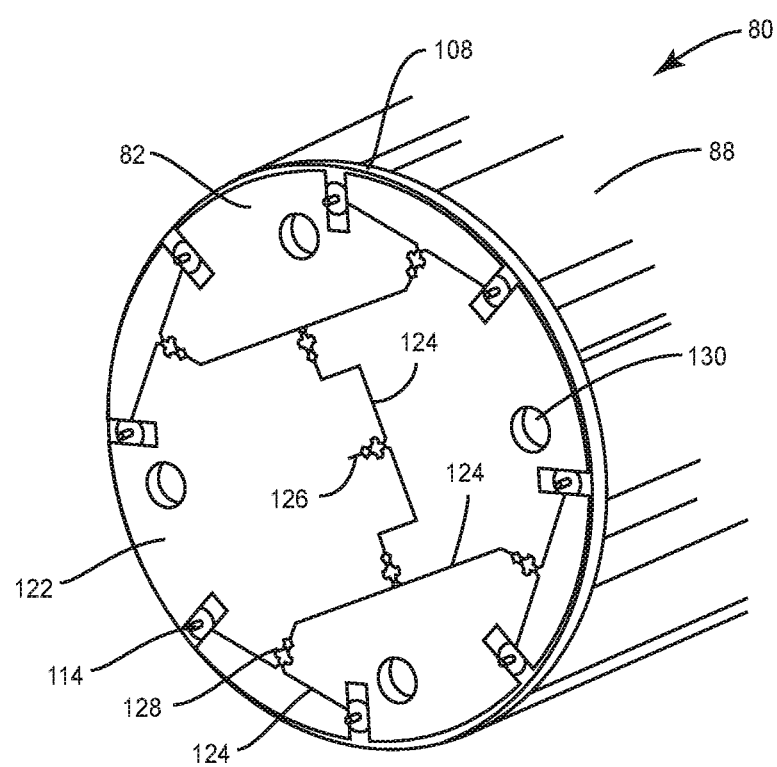
FIG. 5A is a partial perspective view of the spatial power-combining device of FIG. 3 from a side that includes the planar signal splitter.
Figure 5B:
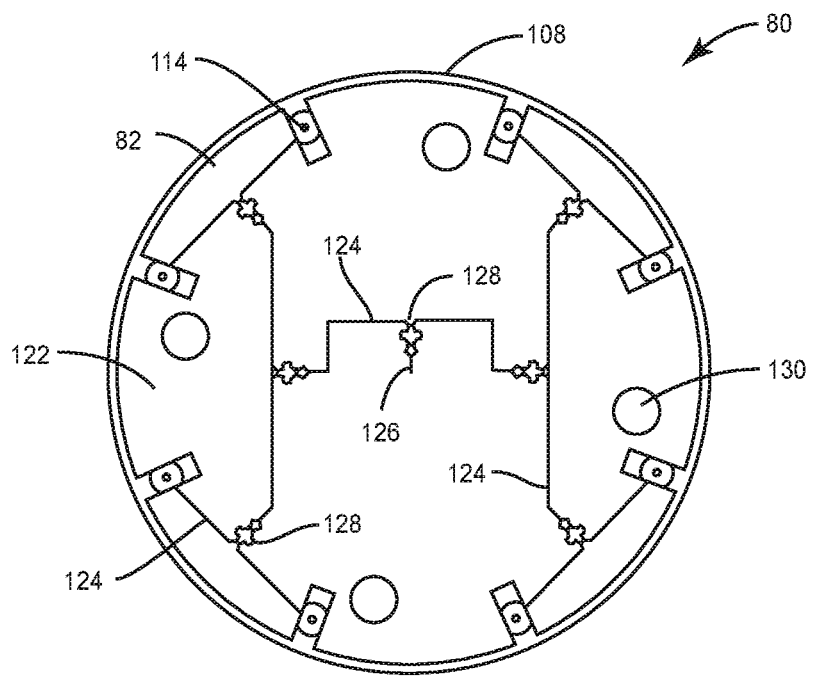
FIG. 5B is a plan view of the spatial power-combining device of FIG. 4 taken from the same side as the partial perspective view of FIG. 5A.

FIG. 5A is a partial perspective view of the spatial power-combining device 80 of FIG. 3 from a side that includes the planar signal splitter 82 and the mounting plate 108. FIG. 5B is a plan view of the spatial power-combining device 80 take from the same side as the partial perspective view of FIG. 5A. In both figures, the input port 106 of FIG. 3 is omitted for illustrative purposes. In certain embodiments, the planar signal splitter 82 comprises a substrate 122 that supports a plurality of transmission lines 124 that are configured for transmission of microwave frequency signals. The substrate 122 may comprise a dielectric substrate, a printed circuit board, or the like. At a center of the substrate 122, an input transmission line 126 is positioned to receive an input signal from the input coaxial pin (112 of FIG. 3) of the input port (106 of FIG. 3). In certain embodiments, the plurality of transmission lines 124 and the input transmission line 126 may comprise microstrip lines. In this regard, a coaxial to microstrip transition is formed at the planar signal splitter 82.

A plurality of power dividers 128 is positioned on the substrate 122 and between one or more of the transmission lines 124 to receive and split signals along the transmission lines 124. In certain embodiments, the plurality of power dividers 128 may comprise two-way and planar wideband splitters or dividers, such as Wilkinson power splitters or dividers, although other power splitting configurations are possible. In operation, an input signal is received at the input transmission line 126 and routed and divided along the transmission lines 124 and the power dividers 128 so that split signals may be delivered to each amplifier assembly coaxial pin 114 that is registered with each amplifier assembly 88. In this regard, the input signal is divided by the planar signal splitter 82 in a direction that is perpendicular to a lengthwise direction of the amplifier assemblies 88 and the spatial power-combining device 80. In certain embodiments, one or more of a wirebond or a ribbon bond may be utilized to connect the transmission lines 124 and the amplifier assembly coaxial pins 114. For an arrangement where the spatial power-combining device 80 is an eight-way power combiner, seven power dividers 128 may be configured to split a single input signal for eight different amplifiers assemblies 88. Additionally, the planar signal splitter 82 and the mounting plate 108 may form one or more mounting holes 130 so that the fasteners (118 of FIG. 3) may mechanically attach the input port (106 of FIG. 3) directly to each amplifier assembly 88 in certain embodiments.

In certain embodiments, the planar signal splitter 82 may comprise a diameter that is less than a diameter of the mounting plate 108 such that when fully assembled, the planar signal splitter 82 is protected by one or more of the mounting plate 108 and the flange (110 of FIG. 3) of the input port (106 of FIG. 3). Depending on the embodiment, the diameter of the planar signal splitter 82 may be at least 1 percent smaller, or at least 5 percent smaller, or at least 10 percent smaller, or in a range including 1 percent smaller and 10 percent smaller, or in a range including 5 percent smaller and 10 percent smaller than the diameter of the mounting plate 108. By way of example, for a 4 GHz to 40 GHz spatial power-combining device, the diameter of the mounting plate 108 may be configured to be 2 inches while the diameter of the planar signal splitter 82 may be configured to be 1.84 inches.

Figure 6:
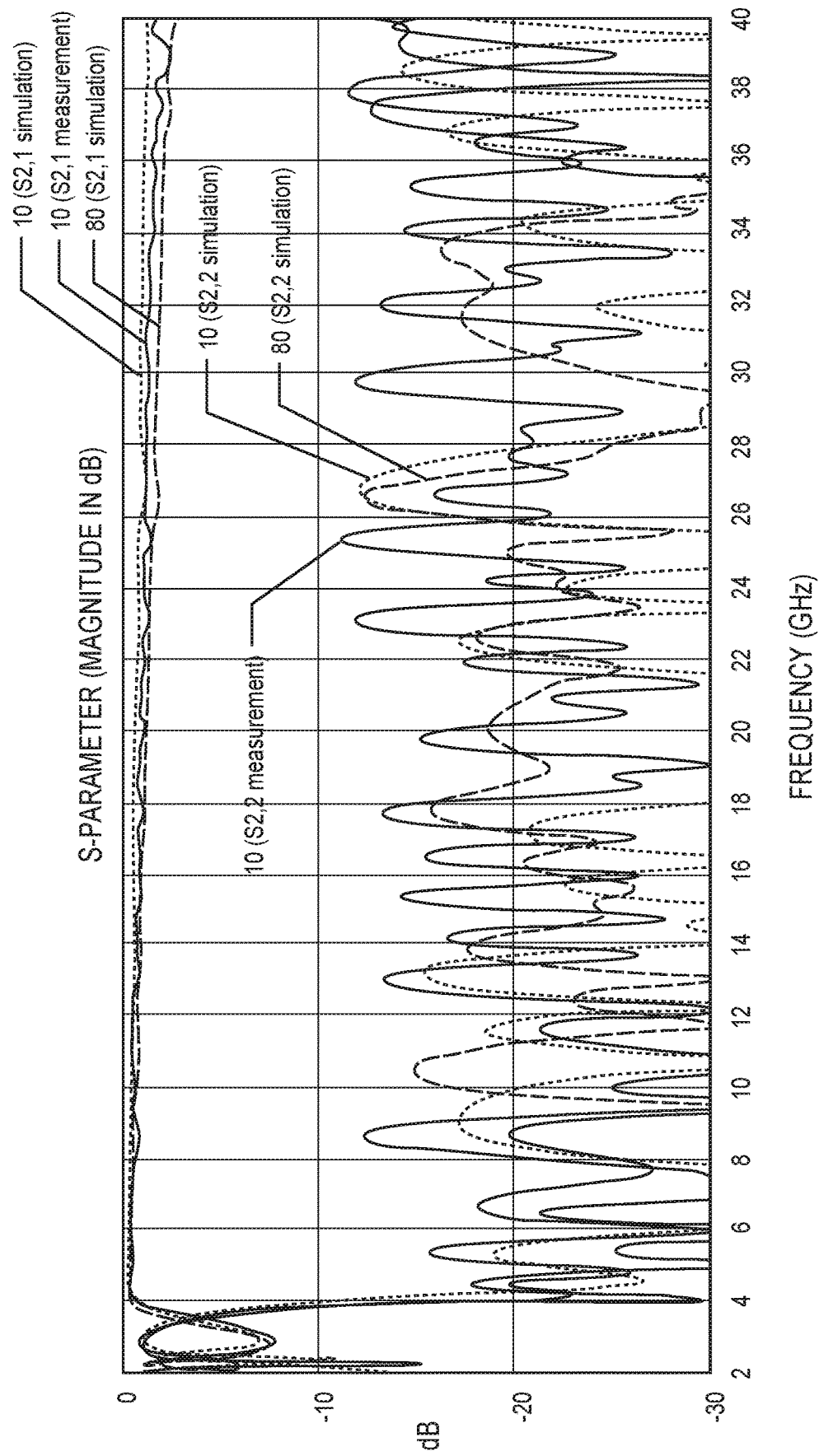
FIG. 6 is a scattering parameters (S-parameters) plot comparing frequency responses of the spatial power-combining device of FIG. 3 and the spatial power-combining device of FIG. 2.

FIG. 6 is a scattering parameters (S-parameters) plot comparing frequency responses of the spatial power-combining device 80 of FIG. 3 and the spatial power-combining device 10 of FIG. 2. The S-parameter magnitude is plotted in decibels (dB) across a GHz frequency range for where both spatial power-combining devices 10, 80 are configured for 4 GHz to 40 GHz operation. The return loss, or S2,2, is an indication of how much power is reflected. For frequencies where S2,2 is equal to 0 dB, then substantially all power from a signal is reflected. The insertion loss, or S2,1, is an indication of how much power is transferred. For frequencies where S2,1 is equal to 0 dB, then substantially all power from a signal is transferred. As illustrated, overall insertion losses and return losses are comparable between the spatial power-combining devices 10, 80. In this regard, input antenna structures may be replaced with planar signal splitters (82 of FIG. 3) for applications where reduced sizes and weight are desirable without significant degradation of frequency performance. While the frequency responses are generally similar, the insertion loss for the spatial power-combining device 80 does predict an increase of about 0.5 to 2 dB compared with the spatial power-combining device 10 across the operating frequency band. This difference can be correlated to the insertion loss contributed by replacing input antenna structures with the planar signal splitter (82 of FIG. 3). In certain embodiments, this may be compensated with increases to the input power for the spatial power-combining device 80.

As disclosed herein, spatial power-combining devices are provided that employ a hybrid structure including both a planar splitter/combiner and an antipodal antenna array. Planar splitters may be arranged between an input port and amplifiers, and antipodal antenna arrays may be arranged between the amplifiers and an output port. In other embodiments, the order may be reversed such that antipodal antenna arrays are arranged between the input port and amplifiers while a planar combiner is arranged between the amplifiers and the output port. Advantages of such spatial power-combining devices include reduced size and weight while maintaining suitable performance for operation in desired frequency bands. While embodiments are provided for eight-way spatial power-combining devices that include eight amplifier assemblies, the aspects disclosed herein are also applicable to other configurations, including sixteen-way spatial power-combining devices.

In certain embodiments, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A spatial power-combining device comprising:
   an input port and an output port;
   a plurality of amplifier assemblies arranged between the input port and the output port, wherein each amplifier assembly of the plurality of amplifier assemblies comprises an amplifier and an output antenna structure coupled with the amplifier, and the plurality of amplifier assemblies is arranged radially around a center axis of the spatial power-combining device; and
   a planar signal splitter arranged between the input port and the plurality of amplifier assemblies.

2. The spatial power-combining device of claim 1, wherein the planar signal splitter comprises a plurality of transmission lines on a substrate.

3. The spatial power-combining device of claim 2, further comprising an input transmission line configured to receive an input signal from the input port.

4. The spatial power-combining device of claim 3, wherein the plurality of transmission lines and the input transmission line comprise microstrip lines.

5. The spatial power-combining device of claim 3, wherein a coaxial to microstrip transition is formed between the input port and the input transmission line.

6. The spatial power-combining device of claim 2, wherein the planar signal splitter further comprises a plurality of power dividers arranged on the substrate and between one or more transmission lines of the plurality of transmission lines.

7. The spatial power-combining device of claim 6, wherein the plurality of power dividers comprises a plurality of Wilkinson power dividers.

8. The spatial power-combining device of claim 2, wherein the plurality of transmission lines is configured to provide a portion of an input signal to each individual amplifier assembly of the plurality of amplifier assemblies.

9. The spatial power-combining device of claim 1, further comprising a mounting plate arranged between the planar signal splitter and the plurality of amplifier assemblies.

10. The spatial power-combining device of claim 9, wherein a diameter of the planar signal splitter is less than a diameter of the mounting plate.

11. The spatial power-combining device of claim 10, wherein the input port comprises a diameter that is the same as the diameter of the mounting plate.

12. The spatial power-combining device of claim 1, wherein the amplifier comprises a monolithic microwave integrated circuit (MMIC) amplifier.

13. The spatial power-combining device of claim 1, wherein the output antenna structure comprises an output signal conductor and an output ground conductor.

14. The spatial power-combining device of claim 1, further comprising an output coaxial waveguide section arranged between the output port and the plurality of amplifier assemblies.

15. A spatial power-combining device comprising:
   an input port and an output port;
   a plurality of amplifier assemblies arranged between the input port and the output port, wherein each amplifier assembly of the plurality of amplifier assemblies comprises an amplifier and an antenna structure coupled with the amplifier, and the plurality of amplifier assemblies is arranged radially around a center axis of the spatial power-combining device; and
   a plurality of fasteners that extend through a flange of the input port or a flange of the output port such that the plurality of fasteners contacts the plurality of amplifier assemblies.

16. The spatial power-combining device of claim 15, wherein a length of the spatial power-combining device as measured between the input port and the output port is in a range including 2 inches and 3 inches.

17. The spatial power-combining device of claim 15, further comprising a planar signal splitter arranged between the input port and the plurality of amplifier assemblies.

18. The spatial power-combining device of claim 17, wherein the plurality of fasteners extends through the planar signal splitter.

19. The spatial power-combining device of claim 17, further comprising a mounting plate arranged between the planar signal splitter and the plurality of amplifier assemblies.

20. The spatial power-combining device of claim 19, wherein the plurality of fasteners extends through the mounting plate.

21. The spatial power-combining device of claim 17, wherein the planar signal splitter comprises a plurality of transmission lines coupled with a plurality of power dividers on a substrate.

22. A spatial power-combining device comprising:
   an input port and an output port; and
   a plurality of amplifier assemblies arranged between the input port and the output port, wherein each amplifier assembly of the plurality of amplifier assemblies comprises an amplifier and an antenna structure coupled with the amplifier, and the plurality of amplifier assemblies is arranged radially around a center axis of the spatial power-combining device;
   wherein the spatial power-combining device is configured to operate across a frequency range including 4 gigahertz (GHz) and 40 GHz and the spatial power-combining device comprises a length as measured between the input port and the output port that is less than 3 inches.

23. The spatial power-combining device of claim 22, further comprising a planar signal combiner arranged between the output port and the plurality of amplifier assemblies, wherein the antenna structure is an input antenna structure configured to divide an input signal from the input port.

24. The spatial power-combining device of claim 22, wherein the length is in a range including 2 inches and 3 inches.

25. The spatial power-combining device of claim 22, further comprising a planar signal splitter arranged between the input port and the plurality of amplifier assemblies, wherein the antenna structure is an output antenna structure configured to combine amplified signals from the amplifier of each amplifier assembly of the plurality of amplifier assemblies.

* * * * *